US009495485B2

(12) United States Patent
Matsuike et al.

(10) Patent No.: US 9,495,485 B2
(45) Date of Patent: Nov. 15, 2016

(54) INFORMATION PROCESSING DEVICE, INFORMATION PROCESSING METHOD, COMPUTER READABLE STORAGE MEDIUM STORING INFORMATION PROCESSING PROGRAM, THICKNESS AREA SETTING DEVICE, THICKNESS AREA SETTING METHOD, AND COMPUTER READABLE STORAGE MEDIUM STORING THICKNESS AREA SETTING PROGRAM

(75) Inventors: Hiroshi Matsuike, Tokyo (JP); Naoki Hirai, Tokyo (JP)

(73) Assignees: SONY CORPORATION, Tokyo (JP); SONY INTERACTIVE ENTERTAINMENT INC., Tokyo (JP)

( * ) Notice: Subject to any disclaimer, the term of this patent is extended or adjusted under 35 U.S.C. 154(b) by 469 days.

(21) Appl. No.: 13/478,357

(22) Filed: May 23, 2012

(65) Prior Publication Data

US 2012/0303340 A1 Nov. 29, 2012

(30) Foreign Application Priority Data

May 25, 2011 (JP) ................................ 2011-116858

(51) Int. Cl.
*G06F 17/50* (2006.01)
*A63F 13/577* (2014.01)
*G06T 19/00* (2011.01)
*G06T 7/20* (2006.01)

(52) U.S. Cl.
CPC ......... *G06F 17/5009* (2013.01); *A63F 13/577* (2014.09); *A63F 2300/64* (2013.01); *A63F 2300/643* (2013.01); *G06F 17/50* (2013.01); *G06T 7/2033* (2013.01); *G06T 2207/30241* (2013.01); *G06T 2210/21* (2013.01)

(58) Field of Classification Search
None
See application file for complete search history.

(56) References Cited

U.S. PATENT DOCUMENTS

| 2003/0112281 | A1* | 6/2003 | Sriram et al. ................. 345/958 |
| 2004/0002380 | A1* | 1/2004 | Brosnan et al. ................ 463/32 |
| 2004/0166934 | A1* | 8/2004 | Nakata et al. .................. 463/30 |
| 2005/0119858 | A1* | 6/2005 | Breneman ..................... 702/155 |
| 2008/0291216 | A1* | 11/2008 | Cheng et al. ................. 345/619 |

(Continued)

FOREIGN PATENT DOCUMENTS

| JP | 6-60151 | 3/1994 |
| JP | 8-96025 | 4/1996 |

(Continued)

OTHER PUBLICATIONS

Haverford College Physics Trigonometric Identities, On the Web at http://www.haverford.edu/physics/MathAppendices/Trig_Ident.pdf (Apr. 2009), 6 pages.*

(Continued)

*Primary Examiner* — Aniss Chad
*Assistant Examiner* — David M Rogers
(74) *Attorney, Agent, or Firm* — Katten Muchin Rosenman LLP

(57) ABSTRACT

An information processing device includes target object information obtaining unit configured to obtain target object information indicating a position and an area of a target object in a virtual space, surface information obtaining unit configured to obtain surface information indicating a position and an area of a thickness area that is defined by a surface in the virtual space and a predetermined thickness imparted to the surface, and collision determining unit configured to carry out collision determination, based on the target object information and the surface information, so as to determine whether the target object has collided against the surface.

9 Claims, 9 Drawing Sheets

(56) References Cited

U.S. PATENT DOCUMENTS

| | | | |
|---|---|---|---|
| 2008/0312010 A1* | 12/2008 | Marty et al. | 473/447 |
| 2009/0143124 A1* | 6/2009 | Hughes et al. | 463/2 |
| 2010/0137071 A1* | 6/2010 | Werner et al. | 473/292 |
| 2010/0261526 A1* | 10/2010 | Anderson et al. | 463/31 |
| 2012/0310610 A1* | 12/2012 | Ito et al. | 703/6 |

FOREIGN PATENT DOCUMENTS

| | | |
|---|---|---|
| JP | 2001-243498 | 9/2001 |
| JP | 2004-295255 | 10/2004 |
| JP | 2005-27921 | 2/2005 |
| JP | 2008-40800 | 2/2008 |

OTHER PUBLICATIONS

D. Eberly, et al., in "Intersection of Orthogonal View Frustrum and Oriented Bounding Box Using Separation Axis Testing," on the Web at http://www.geometrictools.com/Documentation/IntersectionBox3Frustum3.pdf, as saved in Wayback Web Achieve, Jul. 10, 2007, 8 pages.*

S. Gottschalk, et al., "OBBTree: A Hierarchical Structure for Rapid Interference Detection." Proceedings of the 23rd Annual Conference on Computer Graphics and Interactive Techniques, pp. 171-180. ACM, 1996.*

S. Gottschalk, "Collision Queries Using Oriented Bounding Boxes," PhD. Thesis, University of North Carolina, Chapel Hill, Department of Computer Science., 2000, 192 pages.*

J. Ohlenburg, "Efficient Collision Detection for Dynamic Objects in Distributed Virtual Environments," Thesis, Rhine-Westphalia Institute of Technology Aachen, Germany, 2003, 110 pages.*

Japanese Office Action dated May 7, 2013, from corresponding Japanese Application No. 2011-116858.

Japanese Office Action dated Oct. 8, 2013, from corresponding Japanese Application No. 2011-116858.

* cited by examiner

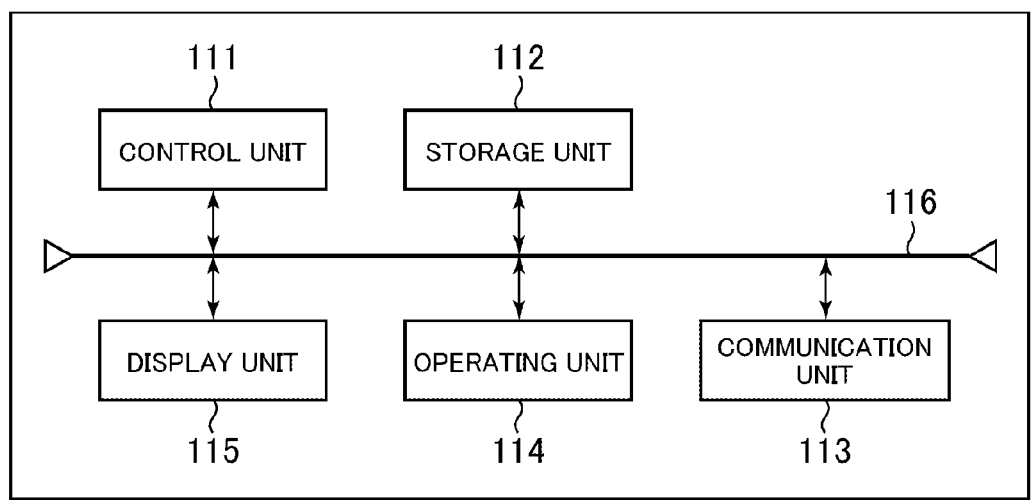
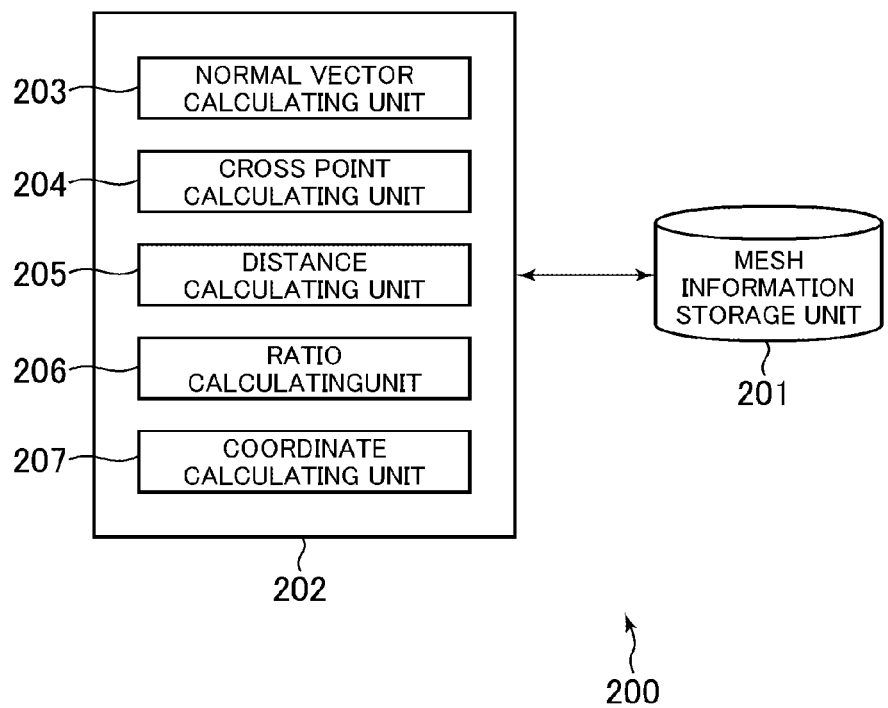

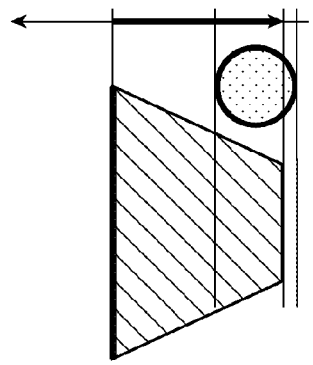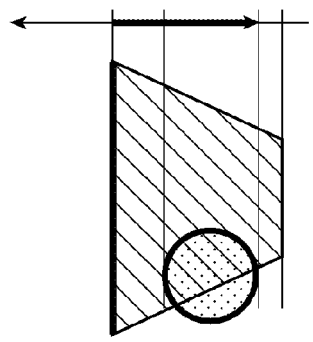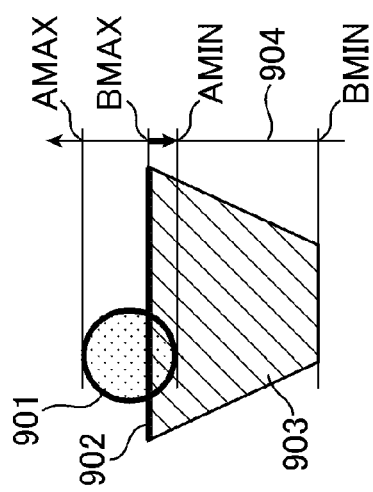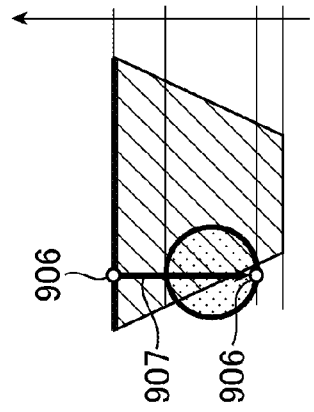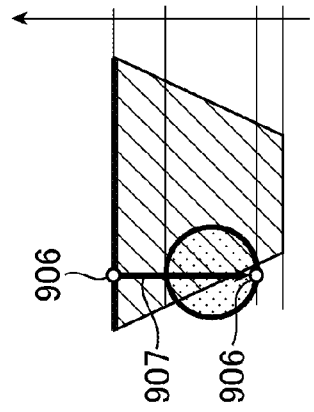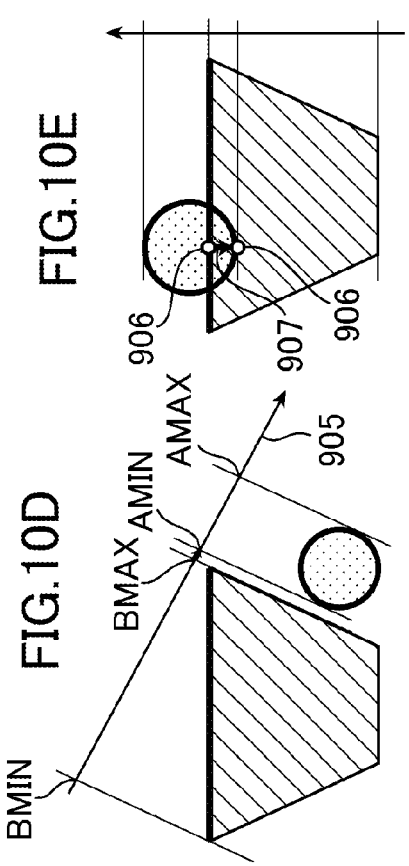

INFORMATION PROCESSING DEVICE, INFORMATION PROCESSING METHOD, COMPUTER READABLE STORAGE MEDIUM STORING INFORMATION PROCESSING PROGRAM, THICKNESS AREA SETTING DEVICE, THICKNESS AREA SETTING METHOD, AND COMPUTER READABLE STORAGE MEDIUM STORING THICKNESS AREA SETTING PROGRAM

CROSS-REFERENCE TO RELATED APPLICATION

The present application claims priority from Japanese Applications JP2011-116858 filed on May 25, 2011, the contents of which are hereby incorporated by reference into this application.

BACKGROUND OF THE INVENTION

1. Field of the Invention

The present invention relates to an information processing device, an information processing method, a computer readable storage medium storing an information processing program, a thickness area setting device, a thickness area setting method, a computer readable storage medium storing a thickness area setting program, a data structure relating to a surface in a virtual space.

2. Description of the Related Art

As a technique for determining a collision between two objects in a virtual space, e.g., a separating axis method and a GJK method have been known. In collision determination using the separating axis method, for example, whether or not there is a separable plane (separating plane) between two objects is determined, and when the separating plane is not there, it is determined that the two objects are collided against each other.

SUMMARY OF THE INVENTION

The above described collision determination method, however, is applied, due to the characteristics of the algorithm, only to collision determination between so-called convex objects. Therefore, to determine a collision between an object having a complicated shape, such as a landform in a virtual space, and an object such as a character, the complicated shape needs to be dissolved into surfaces in order to carry out collision determination between the surface and the object such as a character or the like. In the above, when an object in a virtual space is expressed using a computer, the screen image is updated, e.g., using a discrete time, such as, every frame period or the like. This may cause a problem of so-called undetected collision in determination of a collision between a surface and an object.

In view of the above, one or more embodiments of the present invention has been realized in view of the above, and aim to realize an information processing device, an information processing method, a data structure relating to a surface in a virtual space, or a computer readable storage medium storing an information processing program so as to more appropriately determine presence or absence of a collision between an object having a complicated shape such as a landform in a virtual space and an object such as a character or the like.

Another object of one or more embodiments of the present invention is to realize a thickness area setting device and a thickness area setting method for setting a thickness area with respect to a surface in a virtual space, a data structure relating to a surface in a virtual space, or a computer readable storage medium storing a thickness area setting program so as to more appropriately determine presence or absence of a collision between a target object, such as a landform, having a complicated shape and an object such as a character or the like in a virtual space.

According to one aspect of the present invention, there is provided an information processing device includes target object information obtaining unit configured to obtain target object information indicating a position and an area of a target object in a virtual space. The information processing device also includes surface information obtaining unit configured to obtain surface information indicating a position and an area of a thickness area that is defined by a surface in the virtual space and a predetermined thickness imparted to the surface. The information processing device further includes collision determining unit configured to carryout collision determination, based on the target object information and the surface information, so as to determine whether the target object has collided against the surface.

According to another aspect of the present invention, there is provided an information processing method includes obtaining target object information indicating a position and an area of a target object in a virtual space, obtaining surface information indicating a position and a area of a thickness area that is defined by a surface in the virtual space and a predetermined thickness imparted to the surface, and carrying out collision determination, based on the target object information and the surface information, to determine whether the target object has collided against the surface.

According to another aspect of the present invention, there is provided a thickness area setting device for setting a thickness area in a virtual space includes mesh information obtaining unit configured to obtain mesh information. The mesh information includes vertex information indicating respective vertexes of a first surface in the virtual space, normal information indicating a normal direction of the first surface, angle information indicating an angle formed between the first surface and a second surface that is adjacent to the first surface via a side of the first surface, and thickness information relating to a thickness of the first surface. The thickness area setting device also includes thickness area setting unit configured to set a thickness area formed by extending the first surface, based on the normal information, the angle information, the vertex information, and the thickness information.

According to another aspect of the present invention, there is provided a thickness area setting method for setting a thickness area in a virtual space includes obtaining mesh information. The mesh information includes vertex information indicating respective vertexes of a first surface in the virtual space, normal information indicating a normal direction of the first surface, angle information indicating angles formed between the first surface and a second surface that is adjacent to the first surface via each side of the first surface, and thickness information relating to a thickness of the first surface. The thickness area setting method also includes setting a thickness area formed by extending the first surface, based on the normal information, the angle information, the vertex information, and the thickness information.

BRIEF DESCRIPTION OF THE DRAWINGS

FIG. 1 is a diagram outlining a structure of an information processing device and a thickness area setting device according to an embodiment of the present invention;

FIG. 2 is a diagram explaining a functional structure of a thickness area setting device;

FIG. 10A is a diagram explaining in detail the collision determination shown in FIG. 9;

FIG. 10B is a diagram explaining in detail the collision determination shown in FIG. 9;

FIG. 10C is a diagram explaining in detail the collision determination shown in FIG. 9;

FIG. 10D is a diagram explaining in detail the collision determination shown in FIG. 9;

FIG. 10E is a diagram explaining in detail the collision determination shown in FIG. 9;

FIG. 10F is a diagram explaining in detail the collision determination shown in FIG. 9;

DETAILED DESCRIPTION OF THE INVENTION

Figure 3A:
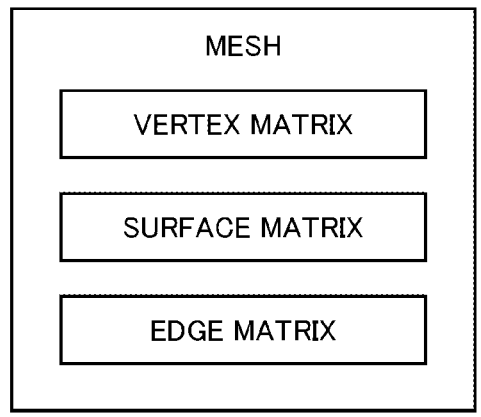
FIG. 3A is a diagram explaining one example of a data structure of mesh information.
Figure 3B:
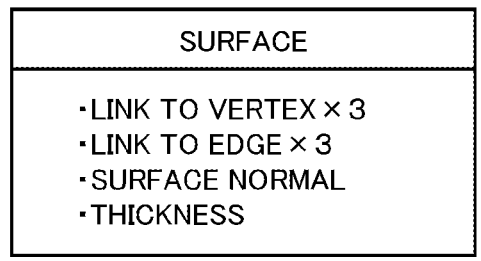
FIG. 3B is a diagram explaining one example of a data structure of mesh information.

In the following, an embodiment of the present invention will be described referring to the drawings. In the drawings, identical or equivalent elements are given identical reference numerals, and a duplicated description is avoided.

FIG. 1 is a diagram schematically showing a structure of an information processing device according to an embodiment of the present invention. As shown in FIG. 1, the information processing device 100 includes a computer comprising e.g., a CPU, a memory, and the like, and further includes, e.g., a control unit 111, a storage unit 112, a communication unit 113, an operating unit 114, and a display unit 115. Note that the control unit 111, the storage unit 112, the communication unit 113, the operating unit 114, and the display unit 115 are connected to each other via an internal bus 116.

The control unit 111 is, e.g., a CPU, an MPU, or the like, and operates according to a program stored in the storage unit 112. The storage unit 112 includes, e.g., an information storage medium, such as a ROM, a RAM, or a hard disk, and stores a program to be executed by the control unit 111. The storage unit 112 operates also as a work memory of the control unit 111. The program may be provided, e.g., by being downloaded via a network or by means of various computer readable information storage media, such as a CD-ROM or a DVD-ROM.

The communication unit 113 connects the information processing device 100 to another information processing device, a database (not shown), or the like via a network. The operating unit 114 includes, e.g., a keyboard, a mouse, a controller, and in response to an instruction operation by a user, outputs the content of the instruction operation to the control unit 111. The display unit 115 is, e.g., a liquid crystal display, an organic EL display, and according to an instruction from the control unit 111, shows information.

Note that the above described structure of the information processing device 100 is merely one example and does not limit the embodiment. A thickness area setting device 200 according to this embodiment has a structure similar to that of the information processing device 100 described above, and the structure of the thickness area setting device 200 is thus not described here.

FIG. 2 is a diagram explaining a functional structure of the thickness area setting device 200 in this embodiment. As shown in FIG. 2, the thickness area setting device 200 includes a mesh information storage unit 201 and a thickness area setting unit 202.

The mesh information storage unit 201 stores information (mesh information) relating to a set of surfaces each expressed using a polygon. As shown in FIG. 3A, the mesh information includes vertex information indicating position coordinates of a vertex of each surface, surface information including information relating to each surface, and edge information including information relating to an edge (side) of each surface. These information items are held in the form of a matrix.

Figure 4:
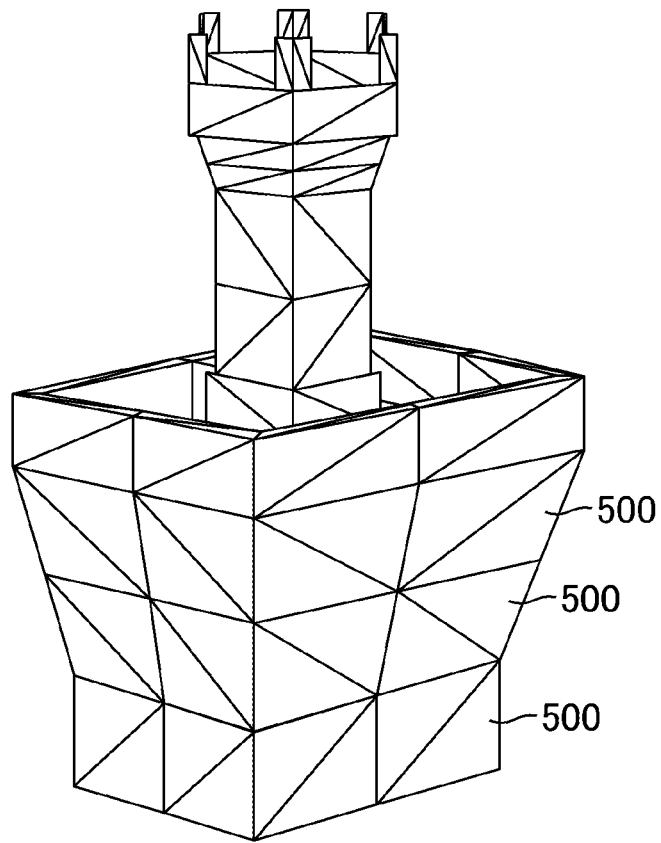
FIG. 4 is a diagram showing one example of a background image in a virtual space.
Figure 5:
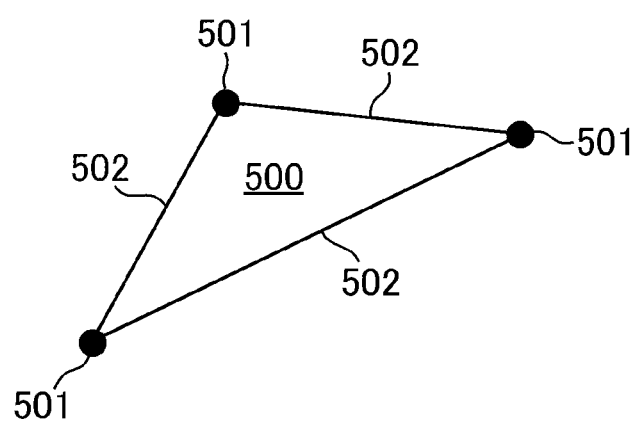
FIG. 5 is diagram explaining a structure of a polygon in the virtual space.

In this embodiment, as shown in FIG. 4, a building, a landform, and the like, as a background in a virtual space (FIG. 4 shows an example of a building) has a mesh structure that is expressed as a set of surfaces each expressed using a triangular polygon. As shown in FIG. 5, each surface (polygon) 500 has a vertex 501 and an edge 502 (corresponding to a side). In this case, information items relating to the vertex 501, the surface 500, and the edge 502, shown in FIGS. 4 and 5, correspond to the vertex information, the surface information, and the edge information, respectively.

Specifically, for example, when each polygon is rectangular, as shown in FIGS. 4 and 5, the vertex information includes, e.g., three sets of position coordinates in the virtual space. The surface information includes, as shown in FIG.

Figure 3C:
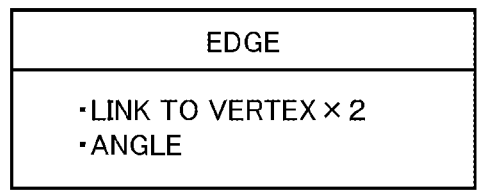
FIG. 3C is a diagram explaining one example of a data structure of mesh information.

3B, link information relating to link to three vertexes of the surface, three edge information items relating to link to the edges of the surface, a normal vector indicating the normal direction of the surface, and thickness information indicating a thickness distance of the surface, to be described later. The edge information includes, as shown in FIG. 3C, two link information items relating to link to the vertexes of each edge, and angle information relating to the angle formed between adjacent surfaces via the edge. The angle corresponds to, e.g., an angle formed by normal vectors of two adjacent surfaces via the edge.

The thickness area setting unit 202 sets a thickness area that is formed by extending a surface, based on the normal information, angle information, vertex information, and thickness information obtained from the mesh information storage unit 201. Specifically, an area that is defined by the surface and a cross point is determined based on the normal information, angle information, and vertex information relating to a surface, which are obtained from the mesh information storage unit 201. The cross point is a cross point of respective surfaces formed by extending the respective sides that define the surface. A segment of the area, which has a distance from the surface in excess of the distance indicated by the thickness information, is cut off. The remaining segment of the area is defined as the thickness area of the surface. When the distance between the surface and the cross point is equal to or shorter than the thick distance indicated by the thickness information, the whole area defined by the surface and the cross point is determined as a thickness area.

Next, a functional structure of the thickness area setting unit 202 will be described in detail. As shown in FIG. 2, the thickness area setting unit 202 functionally includes a normal vector calculating unit 203, a cross point calculating unit 204, a distance calculating unit 205, a ratio calculating unit 206, and a coordinate calculating unit 207. Note that, however, the structure shown in FIG. 2 is only an example and does not limit the embodiment.

Based on the vertex information and angle information obtained from the mesh information storage unit 201, the normal vector calculating unit 203 calculates each normal vector of the surfaces formed by perpendicularly extending a surface of concern (a target surface) in the thickness direction, and each normal vector of the surfaces formed by extending the respective sides of the target surface in the thickness direction.

Figure 6A:
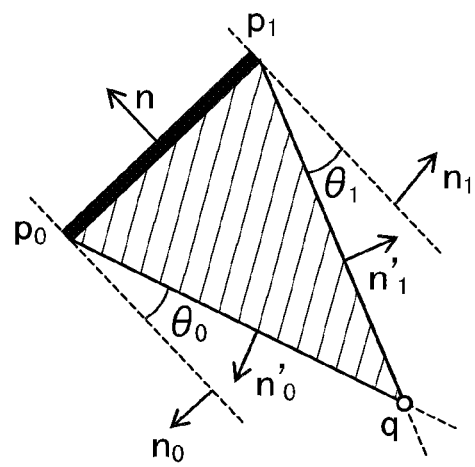
FIG. 6A is a diagram explaining setting of a thickness area.
Figure 6B:
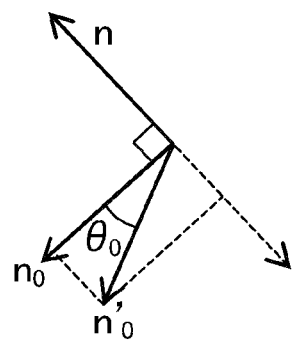
FIG. 6B is a diagram explaining setting of a thickness area.

For example, in the case shown in FIG. 6(A), geometrically, as shown in FIG. 6(B), the normal vector n and the normal vector $n_0$ of a surface formed by perpendicularly extending the target surface in the thickness direction are orthogonal to each other. The angle formed by the normal vector $n_0$ and the normal vector $n'_0$ of a surface formed by extending a side of the target surface in the thickness direction so as to pass through the cross point is an angle $\theta_0$. Therefore, the normal vector $n'_0$ can be obtained using the expression below.

[Expression 1]

$$n'_0 = \cos(\theta_0) n_0 - \sin(\theta_0) n \quad (1)$$

Figure 7:
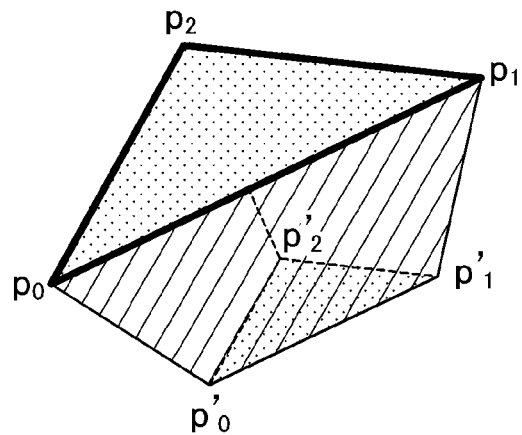
FIG. 7 is a diagram showing one example of a area set as a thickness area.

In the above, in FIGS. 6(A) and 6(B), suppose that the vectors (hereinafter simply referred to as a vertex) indicating the respective vertexes of a surface (a target surface) for which a thickness area is set are defined as $p_0$, $p_1$, $p_2$, respectively, and the cross point of the surfaces formed by extending the respective sides of the target surface in the thickness direction (a direction in which a thickness area is set) is defined as q. Further, the normal vectors of the respective surfaces formed by perpendicularly extending the target surface in the thickness direction are defined as $n_0$, $n_1$, $n_2$, and the normal vectors of the respective surfaces formed by extending the respective sides of the target surface in the thickness direction so as to pass through the cross point are defined as $n'_0$, $n'_1$, $n'_2$. The angle formed between the target surface and a surface adjacent to the target surface via the edge defined by the vertexes $p_0$ and $p_2$ is defined as an angle $\theta_0$, and the angle formed between the target surface and a surface adjacent to the target surface via the edge defined by the vertexes $p_1$ and $p_2$ is defined as an angle $\theta_1$. An area that is set as a thickness area by the thickness area setting unit 202 is shown in FIG. 7. That is, as shown in FIG. 7, the thickness area corresponds to the area defined by the vertexes $p_0$, $p_1$, $p_2$, $p'_0$, $p'_1$, $p'_2$. Below, a method for setting the thickness area will be described.

Note that the vertexes $p_0$, $p_1$, $p_2$, the angles $\theta_0$, $\theta_1$, and the normal vector n are obtained from the mesh information storage unit 201, as described above. Similarly, the normal vectors $n'_1$, $n'_2$ are obtained. The normal vectors $n_0$, $n_1$, $n_2$ are calculated based on the position coordinates of the vertexes $p_0$ to $p_2$ and that the vectors $n_0$, $n_1$, $n_2$ are perpendicular to the normal vector n.

The cross point calculating unit 204 calculates the position coordinates of the cross point, based on the normal vectors, which are calculated as described above, of the surfaces formed by extending the respective sides of the target surface in the thickness direction so as to pass through the cross point, and the position coordinates of the target surface.

Specifically, in the above example, as the cross point q is set so as to exist on the surfaces formed by extending the respective sides of the target surface in the thickness direction, the cross point q satisfies the expression below.

[Expression 2]

$$(q-p_0) \cdot n'_0 = 0$$

$$(q-p_1) \cdot n'_1 = 0$$

$$(q-p_2) \cdot n'_2 = 0 \quad (2)$$

The position coordinates of the cross point q can be obtained by solving the expression (2) as simultaneous expressions, as shown in Expressions (3), (4).

[Expression 3]

$$\begin{pmatrix} n'_{0x} & n'_{0y} & n'_{0z} \\ n'_{1x} & n'_{1y} & n'_{1z} \\ n'_{2x} & n'_{2y} & n'_{2z} \end{pmatrix} \begin{pmatrix} q_x \\ q_y \\ q_z \end{pmatrix} - \begin{pmatrix} p_0 \cdot n'_0 \\ p_1 \cdot n'_1 \\ p_2 \cdot n'_2 \end{pmatrix} = \begin{pmatrix} 0 \\ 0 \\ 0 \end{pmatrix} \quad (3)$$

[Expression 4]

$$\begin{pmatrix} q_x \\ q_y \\ q_z \end{pmatrix} = \begin{pmatrix} n'_{0x} & n'_{0y} & n'_{0z} \\ n'_{1x} & n'_{1y} & n'_{1z} \\ n'_{2x} & n'_{2y} & n'_{2z} \end{pmatrix}^{-1} \begin{pmatrix} p_0 \cdot n'_0 \\ p_1 \cdot n'_1 \\ p_2 \cdot n'_2 \end{pmatrix} \quad (4)$$

Note that $n'_{0x}$ or the like in the expressions (3), (4) indicates a coordinate component of the normal vector $n_0$ or the like in the virtual space that is expressed using x, y, and z axes, and $q_x$ or the like indicates a coordinate component of the cross point q.

The distance calculating unit 205 calculates the distance from the coordinates of the cross point, which is calculated by the cross point calculating unit 204, to the target surface, and determines whether or not the calculated distance is equal to or shorter than the thickness distance obtained from the mesh information storage unit 201. When the distance is equal to or shorter than the thickness distance, the area defined by the target surface and the cross point is set as a thickness area, as described later.

Meanwhile, when the distance between the cross point coordinates and the target surface is determined longer than the thickness distance by the distance calculating unit 205, the ratio calculating unit 206 calculates the ratio between the thickness distance set for the target surface and the distance from the target surface to the cross point, based on the distance calculated by the distance calculating unit 205 and the thickness distance obtained from the mesh information storage unit 201.

Specifically, in the above example, suppose that the ratio of the distance from the target surface to the cross point q is defined as t, t can be obtained using the expression below.

[Expression 5]

$$t = \frac{\text{thickness distance}}{\text{distance from target surface to } q} \quad (5)$$

The coordinate calculating unit 207 calculates the position coordinates of the respective vertexes of an area that is set as a ratioed thickness area, based on the ratio calculated by the ratio calculating unit 206, the position coordinates of the vertexes, and the position coordinates of the cross point.

Specifically, the position coordinates of the respective vertexes of the area that is set as the ratioed thickness area are calculated, using the expression below.

[Expression 6]

$$p'_0 = p_0 + t(q - p_0)$$

$$p'_1 = p_1 + t(q - p_1)$$

$$p'_2 = p_2 + t(q - p_2) \quad (6)$$

The area that is defined by the vertexes $p'_0$ to $p'_2$ of the thickness area calculated as described above or the cross point and the vertexes $p_0$ to $p_2$ is set as a thickness area that is used for collision determination. Information relating to the thickness area, that is, the position coordinates of the surface or point that is opposed to the target surface defining the thickness area, is stored in, e.g., the mesh information storage unit 201. Further, link to the position coordinates is stored as the surface information in, e.g., the mesh information storage unit 201, and the normal vector of the surface formed by extending each side of the target surface in the thickness direction is stored as the surface information in the mesh information storage unit 201. The thickness area as set as described above has a convex shape, and, accordingly, a collision determination method, such as the above described separating axis method or the like, can be employed.

Figure 8:
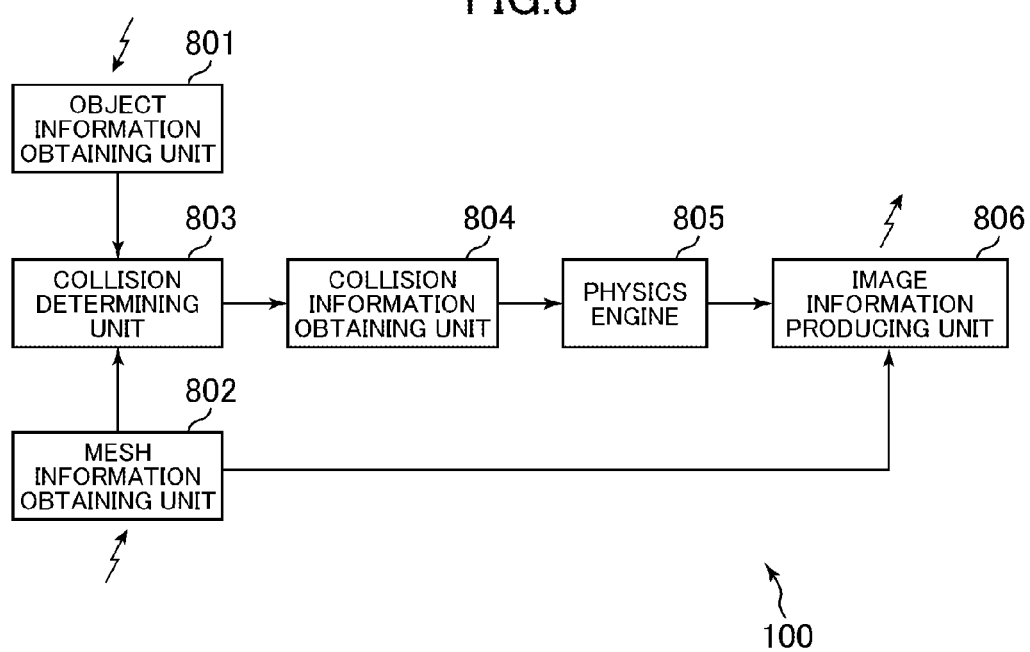
FIG. 8 is a diagram outlining a functional structure of an information processing device.

Next, referring to FIG. 8, a functional structure of the information processing device 100 will be outlined. As shown in FIG. 8, the information processing device 100 includes an object information obtaining unit 801, a mesh information obtaining unit 802, a collision determining unit 803, a collision information obtaining unit 804, a physics engine 805, and an image information producing unit 806.

In the following, for brevity of description, a case in which a spherical rigid body as a target object collides against a surface, to which a thickness area is set as described above, in a virtual space in the current frame period (e.g., one frame period), as shown in FIGS. 9(A) to 9(F), will be described as an example. The following description is based on the assumption that information relating to the thickness area is calculated by the thickness area setting device 200 or the like, and stored in, e.g., the mesh information storage unit 201, as described above. This, however, does not limit the embodiment, and for example, the information processing device 100 may have the function of the above described thickness area setting device 200, and set information relating to the thickness area.

The object information obtaining unit 801 obtains object information including the position, moving direction, speed, and size of a target object 901 for every predetermined period, such as for every frame period. Specifically, for example, the position, moving direction, speed, and size of the object 901 (rigid body) shown in FIG. 9 are obtained. Note that in FIG. 9, the moving direction and speed of a rigid body included in the object information is expressed using a vector v. The target object 901 may be a character that is operated by a user in a virtual space of a game program, or a specific object, such as a ball, in a virtual space created by means of CG (computer graphics) or the like. Note that the object information obtaining unit 801 corresponds to the target object information obtaining unit described in the claims.

The mesh information obtaining unit 802 obtains the mesh information stored in the mesh information storage unit 201. Specifically, information relating to a surface and a thickness area for the surface, that is, e.g., the vertex information relating to the surface 902 and the corresponding thickness area 903, shown in FIG. 9, is obtained. Note that the information relating to the surface 902 and the thickness area 903 corresponding to the surface 902 corresponds to the surface information described in the claims.

Based on the object information and mesh information obtained as described above, the collision determining unit 803 determines whether or not the target object 901 has collided against the target surface. Below, this will be described more specifically, referring to FIG. 10.

Initially, as shown in FIG. 10, the collision determining unit 803 projects the object 901 and the thickness area 903 onto the normal line (corresponding to the separating axis 904) of the surface 902. The respective end points of a segment formed on the separating axis 904 by projecting the object 901 are defined as AMAX and AMIN sequentially in the normal line direction. The respective end points of a segment formed on the separating axis 904 by projecting the thickness area 903 are defined as BMAX and BMIN sequentially in the normal line direction. The position coordinates of the respective AMAX, AMIN, BMAX, BMIN on the separating axis 904 are obtained.

Then, whether the overlap distance (AMIN-BMAX) is equal to or larger than 0 is determined. When the overlap distance (AMIN-BMAX) is equal to or larger than 0, absence of a collision is determined.

Meanwhile, when the overlap distance is smaller than 0, similarly, the object 901 and the thickness area 903 are then projected onto the separating axis 905 (the normal line of a surface of the thickness area 903) of the thickness area 903, as shown in, e.g., FIG. 10D, to obtain position coordinates of the respective AMAX, AMIN, BMAX, BMIN on the separating axis. Then, similarly, whether the overlap distance (AMIN-BMAX) is equal to or larger than 0 is determined.

When the cross distance (AMIN-BMAX) is equal to or larger than 0, absence of a collision is determined. In the case shown in FIG. 10D (corresponding to FIG. 10C), for example, as the overlap distance is equal to or larger than 0, absence of a collision is determined. Meanwhile, when the overlap distance is smaller than 0, presence of a collision is determined. For example, in the cases shown in FIGS. 10(A) and 10(B), as the overlap distance is smaller than 0, presence of a collision is determined.

Figure 9A:
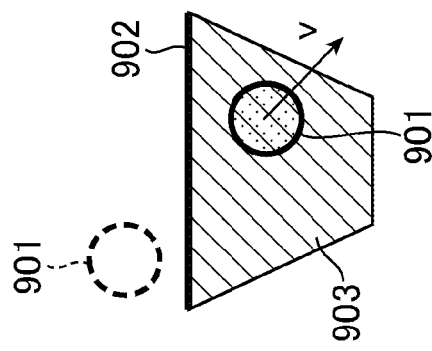
FIG. 9A is a diagram explaining one example of collision determination between a rigid body and a surface in the virtual space.
Figure 9B:
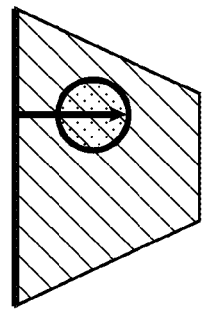
FIG. 9B is a diagram explaining one example of collision determination between a rigid body and a surface in the virtual space.
Figure 9C:
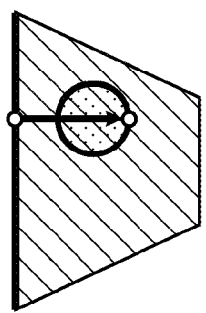
FIG. 9C is a diagram explaining one example of collision determination between a rigid body and a surface in the virtual space.

When the collision determining unit 803 determines presence of a collision, the collision information obtaining unit 804 calculates collision information including collision coordinates, a penetration depth, and a rebound direction, and inputs the collision information into the physics engine 805. Specifically, as shown in FIGS. 9(C), 10(E), and 10(F), for example, two sets of collision coordinates 906 of the rigid body are calculated through geometric calculation, based on the separating axis 904 of the surface 902 and the positions of the object 901 and the surface 902. Also, the length of the vector (collision vector) 907 defined by the two collision coordinates 906 is calculated as information indicating the penetration depth. The direction indicated by the normal vector of the surface 902 is defined as the rebound direction. Note that the two collision coordinates 906 correspond to, e.g., the coordinates (first collision coordinates) obtained by projecting the center of the object 901 onto the surface 902 in parallel to the separating axis 904 of the surface 902, and the coordinates (second collision coordinates) of a point farthest from the first collision coordinates in the thickness direction of the surface 902 in parallel to the separating axis 904 of the surface 902. The direction of the collision vector is the direction, e.g., from the first to second collision coordinates.

Figure 9D:
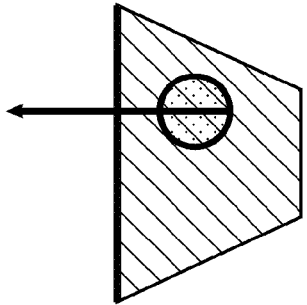
FIG. 9D is a diagram explaining one example of collision determination between a rigid body and a surface in the virtual space.
Figure 9E:
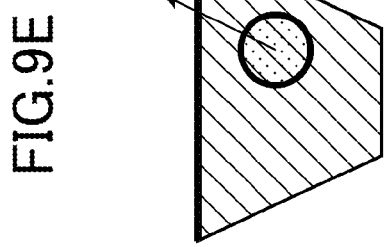
FIG. 9E is a diagram explaining one example of collision determination between a rigid body and a surface in the virtual space.
Figure 9F:
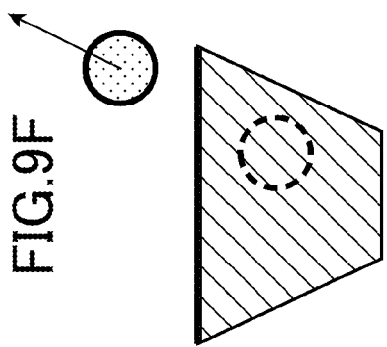
FIG. 9F is a diagram explaining one example of collision determination between a rigid body and a surface in the virtual space.

When the collision determining unit 803 determines presence of a collision, as shown in FIGS. 9(D) to 9(F), for example, the physics engine 805 calculates the rebound force of the collision, based on the collision information, and then calculates the speed of the object 901 at the next time (e.g., in the next frame period), based on the rebound force. Further, based on the collision information and the calculated speed of the object 901, the physics engine 805 calculates the position of the object 901 at the next time. Meanwhile, when the collision determining unit 803 determines absence of a collision, the physics engine 805 calculates the position of the object 901 at the next time, based on the object information. Note that the physics engine 805 corresponds to a computer software for simulating the law of classical mechanics, such as mass, velocity, friction, and wind, as known.

The image information producing unit 806 produces a background image based on the mesh information and an image of the object 901 based on the object information and the position information of the object 901 calculated by the physics engine 805, and then produces as image information an image where, e.g., the image of the object 901 is superimposed onto the background image. The produced image information is shown on, e.g., the display unit 115 of the information processing device 100. The image information may be sent to an outside display device or the like (not shown) via the communication unit 113.

With the above described structure, it is possible to prevent so-called undetected collision which could occur due to lack of thickness of a surface in determination of a collision in a virtual space, and thus to achieve more appropriate determination of a collision between a surface and an object in the virtual space. Further, when a presence of a collision is determined, it is possible not only to prevent the object from penetrating the surface through, but also to reflect the object on the surface and return the object collided against the surface.

Note that the present invention is not limited to the above described embodiment, and various modifications are possible. For example, the above embodiment may be replaced by a structure substantially identical to that which is described in the above described embodiment, a structure realizing an identical effect, or a structure achieving an identical object.

Figure 11A:
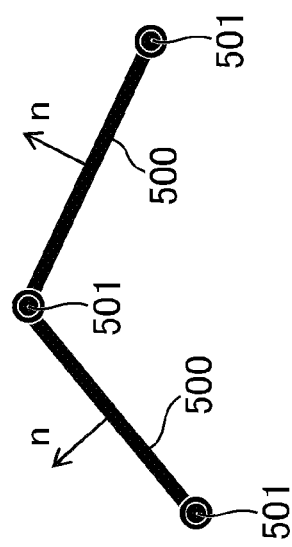
FIG. 11A is a diagram explaining another example of setting of a thickness area.
Figure 11B:
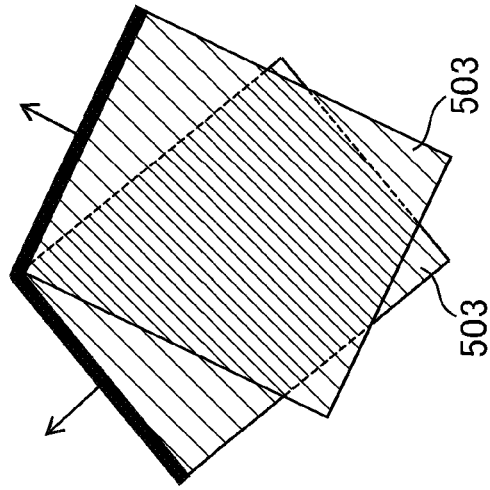
FIG. 11B is a diagram explaining another example of setting of a thickness area.
Figure 11C:
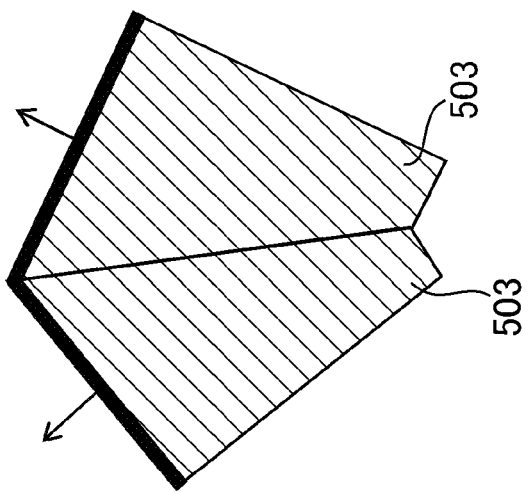
FIG. 11C is a diagram explaining another example of setting of a thickness area.

For example, the setting of the thickness area as described above is merely an example, and does not limit the embodiment. For example, as shown in FIGS. 11(A) to 11(C), thickness areas may be set for adjacent surfaces 500 extending the surfaces 500, as shown in FIG. 11B, based on the thickness information set for the respective adjacent surfaces 500. Then, the thickness areas 503 may be set by eliminating the overlap segment and the segment extending beyond the overlapped segment to the other surface, based on the angular information set for the sides of the adjacent surfaces.

Figure 12A:
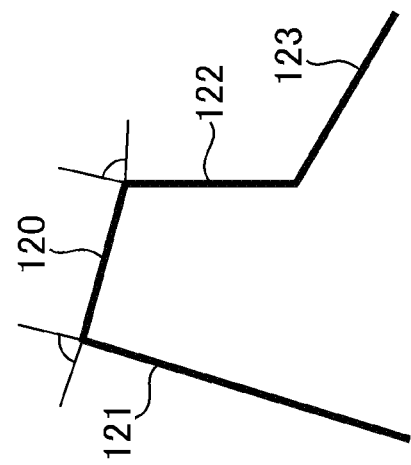
FIG. 12A is a diagram explaining still another example of setting of a thickness area.
Figure 12B:
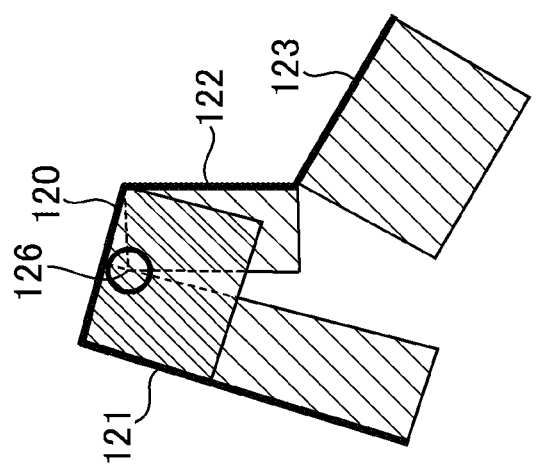
FIG. 12B is a diagram explaining still another example of setting of a thickness area.
Figure 12C:
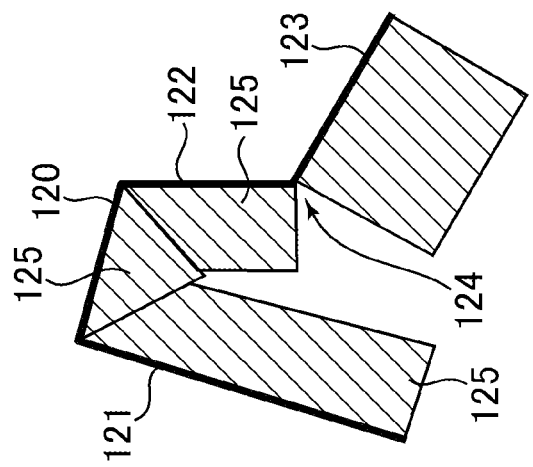
FIG. 12C is a diagram explaining still another example of setting of a thickness area.

Further, as shown in FIGS. 12(A) to 12(C), the respective angles between a surface 120 adjacent to a convex edge of a mesh in the virtual space and respective surfaces 121, 122 adjacent to the surface 120 are set. Thickness distances for the surface 121 and for the surface 122 are set such that the thickness areas 125 of the surface 121 and the surface 122, which is not adjacent to the surface 121, are not interfere with each other. The thickness areas 125 for the respective surfaces 120, 121, 122 maybe set based on the angular set as described above and by eliminating the overlapped portion.

Note that FIG. 12B shows an example in which the thickness areas are set for the surfaces 121, 122, using the distance to the interference point 126 from the respective surfaces 121, 122 as the thickness distances when the respective surfaces 121, 122 are extended and then interfere with each other. In this case, when the thickness area is not set to an area near the concave edge 124 of the mesh as shown in FIG. 12C, the thickness areas of the respective areas 122, 123 may be adjusted such that the thickness areas 122, 123 includes the area by extending the thickness areas 122, 123 adjacent to the area. In this case as well, the thickness areas of the surfaces 122, 123 may be adjusted according to the angle information set for the angle information between the surfaces 122 and 123. Further, although a case in which the separating axis method is employed in collision determination is described in the above, this does not limit the embodiment, and any other method, such as the GJK method, that is applicable to a so-called convex shape may be employed.

What is claimed is:

1. An information processing device comprising:
 a target object information obtaining unit configured to obtain target object information indicating a position and an area of a target object in a virtual space;
 a surface information obtaining unit configured to obtain surface information indicating a position and an area of a thickness area that is defined by a surface in the virtual space and a predetermined thickness imparted to the surface, and
 a collision determining unit configured to carry out collision determination, based on the target object information and the surface information, so as to determine whether the target object has collided against the surface by:
  projecting the target object onto a separating axis to determine a maximum point, Amax, and a minimum point, Amin, on the separating axis, wherein the separating axis is a normal line extending from the surface of the target object;

projecting the thickness onto the separating axis to determine a maximum point, Bmax, and a minimum point, Bmin, on the separating axis; and calculating an overlap distance Amin-Bmax, wherein if the overlap distance≥0 means that no collision has occurred , and if the overlap distance<0 means that a collision has occurred, wherein the thickness area is determined by a thickness area setting unit, comprising:

a mesh information obtaining unit configured to obtain mesh information, wherein the mesh information includes;

vertex information indicating respective vertexes of a first surface in the virtual space, normal information indicating a normal direction of the first surface, angle information indicating an angle formed between the first surface and a second surface that is adjacent to the first surface via a side of the first surface, and thickness information relating to a thickness of the first surface; and a thickness area setting unit configured to set a thickness area formed by extending the first surface, based on the normal information, the angle information, the vertex information, and the thickness information, wherein, when a distance between a cross point and the first surface is equal to or shorter than the thickness, the thickness area setting unit sets, as the thickness area for the first surface, an area defined by the first surface and a cross point of respective surfaces, wherein the cross point of respective surfaces is formed by extending the respective sides defining the first surface, based on the normal information, the angle information, and the vertex information, and wherein, when a distance between a cross point and the first surface is greater than the thickness, the thickness area setting unit sets, as the thickness area for the first surface, a ratioed thickness area, wherein a ratio used in calculating the ratioed thickness area equals a thickness distance divided by the distance between the cross point and the first surface.

2. The information processing device according to claim 1, further comprising collision information obtaining unit configured to obtain collision information when the collision determining unit determines that the target object has collided against the surface, wherein the collision information relates to a position at a time of the collision, a distance of the target object from the surface at the time of the collision, and a rebound direction at the time of the collision.

3. The information processing device according to claim 2 further comprising physics calculation unit configured to carry out physics calculation as to the virtual space, wherein the physics calculation unit calculates, based on the collision information, a position where the target object is shown after the collision.

4. A non-transitory computer readable storage medium storing an information processing program for causing a computer to function as:

a target object information obtaining unit configured to obtain target object information indicating a position and an area of a target object in a virtual space;

a surface information obtaining unit configured to obtain surface information indicating a position and an area of a thickness area that is defined by a surface in the virtual space and a predetermined thickness imparted to the surface, and a collision determining unit configured to carry out collision determination, based on the target object information and the surface information, to determine whether the target object has collided against the surface by:

projecting the target object onto a separating axis to determine a maximum point, Amax, and a minimum point, Amin, on the separating axis, wherein the separating axis is a normal line extending from the surface;

projecting the thickness onto the separating axis to determine a maximum point, Bmax, and a minimum point, Bmin, on the separating axis; and calculating an overlap distance Amin-Bmax, wherein if the overlap distance≥0 means that no collision has occurred , and if the overlap distance<0 means that a collision has occurred, wherein the thickness area is determined by a thickness area setting unit, comprising:

a mesh information obtaining unit configured to obtain mesh information, wherein the mesh information includes;

vertex information indicating respective vertexes of a first surface in the virtual space, normal information indicating a normal direction of the first surface, angle information indicating an angle formed between the first surface and a second surface that is adjacent to the first surface via a side of the first surface, and thickness information relating to a thickness of the first surface; and a thickness area setting unit configured to set a thickness area formed by extending the first surface, based on the normal information, the angle information, the vertex information, and the thickness information, wherein, when a distance between a cross point and the first surface is equal to or shorter than the thickness, the thickness area setting unit sets, as the thickness area for the first surface, an area defined by the first surface and a cross point of respective surfaces, wherein the cross point of respective surfaces is formed by extending the respective sides defining the first surface, based on the normal information, the angle information, and the vertex information, and wherein, when a distance between a cross point and the first surface is greater than the thickness, the thickness area setting unit sets, as the thickness area for the first surface, a ratioed thickness area, wherein a ratio used in calculating the ratioed thickness area equals a thickness distance divided by the distance between the cross point and the first surface.

5. An information processing method comprising:

obtaining, using a processor, target object information indicating a position and an area of a target object in a virtual space;

obtaining surface information indicating a position, an area of a thickness area that is defined by a surface in the virtual space, and a predetermined thickness imparted to the surface, and carrying out collision determination, based on the target object information and the surface information, to determine whether the target object has collided against the surface by:

projecting the target object onto a separating axis to determine a maximum point, Amax, and a minimum point, Amin, on the separating axis, wherein the separating axis is a normal line extending from the surface;

projecting the thickness onto the separating axis to determine a maximum point, Bmax, and a minimum point, Bmin, on the separating axis; and calculating an overlap distance Amin-Bmax, wherein if the overlap distance≥0 means that no collision has occurred, and if the overlap distance<0 means that a collision has occurred, wherein the thickness area is determined by:

obtaining mesh information, wherein the mesh information includes;

vertex information indicating respective vertexes of a first surface in the virtual space, normal information indicating a normal direction of the first surface, angle information indicating an angle formed between the first surface and a second surface that is adjacent to the first surface via a side of the first surface, and thickness information relating to a thickness of the first surface; and setting a thickness area formed by extending the first surface, based on the normal information, the angle information, the vertex information, and the thickness information, when a distance between a cross point and the first surface is equal to or shorter than the thickness, setting, as the thickness area for the first surface, an area defined by the first surface and a cross point of respective surfaces, wherein the cross point of respective surfaces is formed by extending the respective sides defining the first surface, based on the normal information, the angle information, and the vertex information, and when a distance between a cross point and the first surface is greater than the thickness, setting, as the thickness area for the first surface, a ratioed thickness area, wherein a ratio used in calculating the ratioed thickness area equals a thickness distance divided by the distance between the cross point and the first surface.

6. A thickness area setting device for setting a thickness area in a virtual space, comprising:

a mesh information obtaining unit configured to obtain mesh information, wherein the mesh information includes;

vertex information indicating respective vertexes of a first surface in the virtual space, normal information indicating a normal direction of the first surface, angle information indicating an angle formed between the first surface and a second surface that is adjacent to the first surface via a side of the first surface, and thickness information relating to a thickness of the first surface; and a thickness area setting unit configured to set a thickness area formed by extending the first surface, based on the normal information, the angle information, the vertex information, and the thickness information, wherein, when a distance between a cross point and the first surface is equal to or shorter than the thickness, the thickness area setting unit sets, as the thickness area for the first surface, an area defined by the first surface and a cross point of respective surfaces, wherein the cross point of respective surfaces is formed by extending the respective sides defining the first surface, based on the normal information, the angle information, and the vertex information, and wherein, when a distance between a cross point and the first surface is greater than the thickness, the thickness area setting unit sets, as the thickness area for the first surface, a ratioed thickness area, wherein a ratio used in calculating the ratioed thickness area equals a thickness distance divided by the distance between the cross point and the first surface.

7. A thickness area setting method for setting a thickness area in a virtual space, comprising:

obtaining mesh information using a processor, wherein the mesh information includes;

vertex information indicating respective vertexes of a first surface in the virtual space, normal information indicating a normal direction of the first surface, angle information indicating angles formed between the first surface and a second surface that is adjacent to the first surface via each side of the first surface, and thickness information relating to a thickness of the first surface; and setting a thickness area formed by extending the first surface, based on the normal information, the angle information, the vertex information, and the thickness information, wherein, when a distance between a cross point and the first surface is equal to or shorter than the thickness, the thickness area for the first surface is set as an area defined by the first surface and a cross point of respective surfaces, wherein the cross point of respective surfaces is formed by extending the respective sides defining the first surface, based on the normal information, the angle information, and the vertex information, and wherein, when a distance between a cross point and the first surface is greater than the thickness, the thickness area for the first surface is set as a ratioed thickness area, wherein a ratio used in calculating the ratioed thickness area equals a thickness distance divided by the distance between the cross point and the first surface.

8. A non-transitory computer readable storage medium storing a data structure relating to a surface in a virtual space, the data structure comprising:

mesh information including vertex information indicating vertexes of a first surface in a virtual space, normal information indicating a normal direction of the first surface, angle information indicating angles formed between the first surface and a second surface that is adjacent to the first surface via each side of the first surface, and thickness information relating to a thickness of the first surface, and thickness area information relating to a thickness area formed by extending the first surface, based on the normal information, the angle information, the vertex information, and the thickness information, wherein, when a distance between a cross point and the first surface is equal to or shorter than the thickness, the thickness area for the first surface is set as an area defined by the first surface and a cross point of respective surfaces, wherein the cross point of respective surfaces is formed by extending the respective sides defining the first surface, based on the normal information, the angle information, and the vertex information, and wherein, when a distance between a cross point and the first surface is greater than the thickness, the thickness area for the first surface is set as a ratioed thickness area, wherein a ratio used in calculating the ratioed thickness area equals a thickness distance divided by the distance between the cross point and the first surface.

9. A non-transitory computer readable storage medium storing a thickness area setting program for setting a thickness area for a surface in a virtual space, the program for causing a computer to function as:

a mesh information obtaining unit configured to obtaining mesh information, wherein the mesh information includes;

vertex information indicating respective vertexes of a first surface in a virtual space, normal information indicating a normal direction of the first surface, angle information indicating angles formed between the first surface and a second surface that is adjacent to the first surface via each side of the first surface, and thickness information relating to a thickness of the first surface; and a thickness area setting unit configured to setting a thickness area formed by extending the first surface, based on the normal information, the angle information, the vertex information, and the thickness information, wherein, when a distance between a cross point and the first surface is equal to or shorter than the thickness, the thickness area for the first surface is set as an area defined by the first surface and a cross point of respective surfaces, wherein the cross point of respective surfaces is formed by extending the respective sides defining the first surface, based on the normal information, the angle information, and the vertex information, and wherein, when a distance between a cross point and the first surface is greater than the thickness, the thickness area setting unit sets, as the thickness area for the first surface, a ratioed thickness area, wherein a ratio used in calculating the ratioed thickness area equals a thickness distance divided by the distance between the cross point and the first surface.

* * * * *